(12) United States Patent
Kunz et al.

(10) Patent No.: US 9,214,608 B2
(45) Date of Patent: Dec. 15, 2015

(54) LUMINESCENCE DIODE ARRANGEMENT, BACKLIGHTING DEVICE AND DISPLAY DEVICE

(75) Inventors: Thorsten Kunz, Donaustauf (DE); Stephan Kaiser, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 622 days.

(21) Appl. No.: 13/517,320

(22) PCT Filed: Dec. 15, 2010

(86) PCT No.: PCT/EP2010/069812
§ 371 (c)(1),
(2), (4) Date: Jul. 23, 2012

(87) PCT Pub. No.: WO2011/085897
PCT Pub. Date: Jul. 21, 2011

(65) Prior Publication Data
US 2012/0274878 A1 Nov. 1, 2012

(30) Foreign Application Priority Data

Dec. 21, 2009 (DE) .......................... 10 2009 059 889
Mar. 23, 2010 (DE) .......................... 10 2010 012 423

(51) Int. Cl.
*G02F 1/1335* (2006.01)
*F21V 7/04* (2006.01)
(Continued)

(52) U.S. Cl.
CPC .......... *H01L 33/50* (2013.01); *G02F 1/133603* (2013.01); *H01L 25/0753* (2013.01); *H01L 2924/0002* (2013.01)

(58) Field of Classification Search
CPC ........................ H01L 33/50; G02F 1/133603
USPC ...................................... 349/50, 61; 362/612
See application file for complete search history.

(56) References Cited

U.S. PATENT DOCUMENTS

| 6,100,104 A * | 8/2000 | Haerle ............................ 438/33 |
| 6,359,292 B1 | 3/2002 | Sugawara |
| 7,256,557 B2 | 8/2007 | Lim et al. |

(Continued)

FOREIGN PATENT DOCUMENTS

| DE | 10 2005 005 583 A1 | 11/2005 |
| DE | 10 2006 030 890 | 5/2007 |

(Continued)

OTHER PUBLICATIONS

English translation of Japanese Notification of Reasons for Refusal dispatched Feb. 9, 2015 from corresponding Japanese Patent Application No. 2012-545235.

*Primary Examiner* — Paul Lee
(74) *Attorney, Agent, or Firm* — DLA Piper LLP (US)

(57) ABSTRACT

A luminescence diode arrangement includes a first luminescence diode chip, a second luminescence diode chip and a luminescence conversion element, wherein the first luminescence diode chip emits blue light, the second luminescence diode chip contains a semiconductor layer sequence that emits greens light, the luminescence conversion element converts part of the blue light emitted by the first luminescence diode chip into red light, and the luminescence diode arrangement emits mixed light containing blue light of the first luminescence diode chip, green light of the second luminescence diode chip and red light of the luminescence conversion element.

15 Claims, 5 Drawing Sheets

(51) Int. Cl.
*H01L 33/50* (2010.01)
*H01L 25/075* (2006.01)

(56) References Cited

U.S. PATENT DOCUMENTS

| 2002/0075678 | A1* | 6/2002 | Lee | 362/231 |
| 2005/0242360 | A1 | 11/2005 | Su | |
| 2006/0066266 | A1 | 3/2006 | Li Lim et al. | |
| 2007/0086197 | A1* | 4/2007 | Panagotacos et al. | 362/294 |
| 2008/0048193 | A1 | 2/2008 | Yoo et al. | |
| 2008/0164823 | A1* | 7/2008 | Huang et al. | 315/150 |
| 2009/0243504 | A1* | 10/2009 | Cho et al. | 315/251 |

FOREIGN PATENT DOCUMENTS

| JP | 2007-103901 | 4/2007 |
| JP | 2008-300350 | 12/2008 |
| WO | 2008/051397 | 5/2008 |

\* cited by examiner

LUMINESCENCE DIODE ARRANGEMENT, BACKLIGHTING DEVICE AND DISPLAY DEVICE

RELATED APPLICATIONS

This is a §371 of International Application No. PCT/EP2010/069812, with an international filing date of Dec. 15, 2010, which is based on German Patent Application No. 10 2009 059 889.8, filed Dec. 21, 2009 and German Patent Application No. 10 2010 012 423.0, filed Mar. 23, 2010, the subject matter of which is incorporated by reference.

TECHNICAL FIELD

This disclosure relates to a luminescence diode arrangement, a backlighting device and a display device.

BACKGROUND

It could be helpful to provide a luminescence diode arrangement for a backlighting device of a display device with which a large gamut of the display device can be obtained in a cost-effective manner.

SUMMARY

We provide a luminescence diode arrangement including a first luminescence diode chip, a second luminescence diode chip and a luminescence conversion element, wherein the first luminescence diode chip emits blue light, the second luminescence diode chip contains a semiconductor layer sequence that emits greens light, the luminescence conversion element converts part of the blue light emitted by the first luminescence diode chip into red light, and the luminescence diode arrangement emits mixed light containing blue light of the first luminescence diode chip, green light of the second luminescence diode chip and red light of the luminescence conversion element.

We also provide a backlighting device for a display device including a plurality of luminescence diode arrangements.

We further provide a liquid crystal display device including a backlighting device, wherein, with the mixed light emitted by the backlighting device, a gamut is obtained whose area content upon representation in a CIE standard chromaticity diagram amounts to at least 110 percent of an area content of an NTSC color space.

We additionally provide a luminescence diode arrangement including a first luminescence diode chip, a second luminescence diode chip and a luminescence conversion element, wherein the first luminescence diode chip emits blue light, the second luminescence diode chip contains a semiconductor layer sequence that emits green light, the luminescence conversion element converts part of the blue light emitted by the first luminescence diode chip into red light, the luminescence diode arrangement emits mixed light containing blue light of the first luminescence diode chip, green light of the second luminescence diode chip and red light of the luminescence conversion element, the luminescence diode arrangement includes a first optoelectronic component which includes the first luminescence diode chip, and a second optoelectronic component which includes the second luminescence diode chip, and the first optoelectronic component includes a first part of the luminescence conversion element and the second optoelectronic component includes a second part of the luminescence conversion element.

We further additionally provide a luminescence diode arrangement including a first luminescence diode chip, a second luminescence diode chip and a luminescence conversion element, wherein the first luminescence diode chip emits blue light, the second luminescence diode chip contains a semiconductor layer sequence that emits green light, the luminescence conversion element converts part of the blue light emitted by the first luminescence diode chip into red light, the luminescence diode arrangement emits mixed light containing blue light of the first luminescence diode chip, green light of the second luminescence diode chip and red light of the luminescence conversion element, the luminescence diode arrangement includes a first optoelectronic component which includes the first luminescence diode chip, and a second optoelectronic component which includes the second luminescence diode chip, and the first optoelectronic component includes a first part of the luminescence conversion element and the second optoelectronic component includes a second part of the luminescence conversion element.

DETAILED DESCRIPTION

We provide a luminescence diode arrangement which may comprise a first luminescence diode chip, a second luminescence diode chip and a luminescence conversion element is specified. A "luminescence diode chip", is understood to be an optoelectronic semiconductor chip comprising a semiconductor layer sequence provided for generating radiation, for example, a light emitting diode chip or a laser diode chip.

A backlighting device comprising the luminescence diode arrangement may be configured in particular for backlighting a display device. The backlighting device contains, in particular, a plurality of the luminescence diode arrangements. In particular, the luminescence diode arrangements contained in the backlighting device are of identical construction.

A display device may comprise the backlighting device. The display device can be a liquid crystal display device (LCD) such as an LCD television. By way of example, the backlighting device is configured for backlighting a light valve arrangement of the LCD.

The first luminescence diode chip may be configured to emit blue light. The second luminescence diode chip may be configured, in particular, to emit green light. Preferably, it contains a semiconductor layer sequence configured to emit the green light. The luminescence conversion element may be configured, in particular, to convert part of the blue light emitted by the first luminescence diode chip into red light. Expediently, the first luminescence diode chip emits blue light during the operation of the luminescence diode arrangement, the second luminescence diode chip emits green light during the operation of the luminescence diode arrangement, and the luminescence conversion element emits red light during the operation of the luminescence diode arrangement.

The fact that the first luminescence diode chip emits blue light means in particular that the electromagnetic radiation emitted by the first luminescence diode chip during operation has a dominant wavelength in the blue spectral range, in particular 420 nm to 490 nm, preferably 430 nm to 480 nm, in each case inclusive of the limits. In one configuration, the dominant wavelength is 435 nm to 445 nm, inclusive of the limits. By way of example, it has a value of 440 nm. In another configuration, it is 445 nm to 455 nm, inclusive of the limits. By way of example, it has a value of 450 nm.

The fact that the semiconductor layer sequence of the second luminescence diode chip emits green light means in particular that the electromagnetic radiation emitted by the semiconductor layer sequence during operation has a dominant wavelength in the green spectral range, in particular 490 nm to 575 nm, preferably 500 nm to 550 nm, in each case inclusive of the limits. By way of example, the dominant wavelength is 520 nm to 530 nm, inclusive of the limits. By way of example, it has a value of 525 nm.

"Dominant wavelength" means, in particular, the wavelength of that spectral color which brings about the same color impression as the light emitted by the first or second luminescence diode chip.

The fact that the luminescence conversion element converts blue light into red light means in particular that the luminescence conversion element absorbs electromagnetic primary radiation having a wavelength in the blue spectral range and emits electromagnetic secondary radiation having an intensity maximum having a wavelength in the red spectral range, in particular 620 nm to 750 nm, preferably 630 nm to 700 nm, in each case inclusive of the limits. By way of example, the intensity maximum of the secondary radiation has a wavelength of 650 nm to 750 nm, preferably 610 nm to 640 nm, in each case inclusive of the limits.

The luminescence diode arrangement may be configured to emit mixed light containing blue light of the first luminescence diode chip, green light of the second luminescence diode chip and red light of the luminescence conversion element. In particular, the mixed light consists of blue light of the first luminescence diode chip, green light of the second luminescence diode chip and red light of the luminescence conversion element.

Preferably, the mixed light brings about a white color impression. To put it another way, the mixed light preferably has a color locus in the white region of the CIE standard chromaticity diagram. The CIE standard chromaticity diagram, also called "CIE diagram," serves for representing the x and y co-ordinates of the standard chromaticity system developed by the International Commission On Illumination (CIE, Commission international de l'éclairage) in 1931.

To convert blue light of the first luminescence diode chip into red light, the luminescence conversion element may contain at least one phosphor, for example, an inorganic phosphor such as an aluminum nitride phosphor. The luminescence conversion element can consist of the phosphor or it can comprise a matrix material into which the phosphor is embedded.

By way of example, the luminescence conversion element comprises a ceramic material which consists of the phosphor or a plurality of phosphors or contains at least one phosphor. The luminescence conversion element can also contain a powder layer, for example, deposited electrophoretically, comprising one or a plurality of phosphors. Alternatively, particles of at least one phosphor can be embedded into a matrix material, for example, an epoxy resin or a silicone material.

The mixed light emitted by the luminescence diode arrangement during operation may have an intensity maximum in the green spectral range. In this configuration, the luminescence diode arrangement is preferably free of a phosphor having an intensity maximum in the green spectral range. In particular, in this configuration, the luminescence conversion element contains no phosphor which emits secondary light having an intensity maximum in the green spectral range during the operation of the luminescence diode arrangement.

It is possible to obtain an emission spectrum of the mixed light that is particularly insensitive to temperature fluctuations and aging. The lifetime of the luminescence diode arrangement until falling below the so-called "L50/B50" threshold is, for example, greater than 20,000 operating hours. The risk of fluctuations of the color locus of the mixed light emitted by the luminescence diode arrangement on account of temperature changes or operating duration of the luminescence diode arrangement is reduced in comparison with luminescence conversion elements containing phosphors that emit green light.

The term "L50/B50" is known. In particular, an "L50/B50" threshold of more than 20,000 operating hours means that, of a multiplicity of luminescence diode arrangements of identical type, 50% of the luminescence diode arrangements have a lifetime of at least 20,000 operating hours and at this time still emit light which has at least 50% of the luminous intensity and/or luminance of the light emitted at zero operating hours. The so-called "L70/B30" threshold, at which 70% of the luminescence diode arrangements still attain 70% of the initial luminous intensity and/or luminance, may have a value of 5000 operating hours or more.

The green light emitted by the second luminescence diode chip may have in the CIE standard chromaticity diagram a color locus for whose co-ordinates $[x_G, y_G]$ the following hold true: $x_G \leq 0.15$ and $y_G \geq 0.7$. Preferably, the following hold true for the co-ordinates $[x_G, y_G]$: $0 \leq x_G \leq 0.15$ and $0.7 \leq y_G \leq 0.9$.

In the CIE standard chromaticity diagram, such a color locus advantageously lies comparatively close to the color loci assigned to the spectral colors of the green spectral range. By contrast, phosphors that emit green light, for example, orthosilicate phosphors, have in the CIE standard chromaticity diagram color loci that are farther away from the color loci of the spectral colors of the green spectral range. Advantageously, in the case of the luminescence diode arrangement, display devices having a larger gamut can thus be obtained by comparison with luminescence diode arrangements containing phosphors to generate green light.

"Gamut" denotes, in particular, the set of all colors which the display device can represent. In the CIE diagram, the gamut corresponds to a delimited area, for example, a triangular area. The display device can only reproduce color stimuli that lie within this area.

In the display device, with the mixed light emitted by the luminescence diode arrangement or the luminescence diode arrangements of the backlighting device, a gamut may be obtained whose area content upon representation in the CIE standard chromaticity diagram amounts to at least 100%, preferably at least 110%, particularly preferably at least 120%, of the area content of the NTSC color space. In this case, NTSC color space is understood to mean that color locus range delimited by a triangle having the co-ordinates [0.67; 0.33], [0.21; 0.71] and [0.14; 0.08] in the CIE diagram.

The luminescence diode arrangement may be provided to emit the mixed light from a front side. The first luminescence diode chip, in a top view of the front side, may be covered by the luminescence conversion element at least in places. It is possible that the second luminescence diode chip is not covered by the luminescence conversion element or is covered by the luminescence conversion element at least in places. The luminescence diode arrangement can advantageously be produced in a particularly simple manner if all the luminescence diode chips are covered by the luminescence conversion element.

For example, when the second luminescence diode chip is covered by the luminescence conversion element at least in places, the luminescence conversion element is additionally configured, in particular, to convert part of the electromagnetic radiation emitted by the second luminescence diode chip, in particular part of the green light emitted by the semiconductor layer sequence, into red light.

The luminescence conversion element—in particular with a further phosphor—may be configured to convert blue light of the first luminescence diode chip and/or green light of the second luminescence diode chip into yellow light. A particularly high total efficiency of the luminescence diode arrangement is achievable in this way.

The luminescence conversion element may be embodied as a separately produced converter plate which can be formed on the first luminescence diode chip or applied thereto. In particular, the converter plate is in this case applied or formed on a front-side main area of the first luminescence diode chip. In this case, the conversion material is, in particular, not introduced into a potting with which the luminescence diode chip is potted.

The luminescence conversion element may be embodied as a separately produced cap, which, in addition to the front-side main area of the first luminescence diode chip, also covers or can cover the side flanks thereof at least in places. That is to say that, in this case, the luminescence conversion element is also disposed subsequent of side faces of the luminescence diode chip. In the case of a luminescence conversion element embodied as a cap, it is possible, in particular, for a gap to be formed between the luminescence diode chip and the luminescence conversion element, which gap can be filled with air, for example. In this case, the luminescence conversion element is heated to a lesser extent during operation than in the case of the use of a luminescence conversion element in direct contact with the luminescence diode chip. Aging of the luminescence conversion element can be slowed down in this way.

All the luminescence diode chips of the luminescence diode arrangement—and in particular all the luminescence diode chips of the backlighting device—may be configured to emit visible and/or ultraviolet light having a dominant wavelength outside the red spectral range. In particular, all the luminescence diode chips of the luminescence diode arrangement or of the backlighting device may emit visible light having an intensity maximum having a wavelength outside the red spectral range, in particular in the blue and/or green spectral range. All the luminescence diode chips of the luminescence diode arrangement—and in particular the luminescence diode chips of all the luminescence diode arrangements of the backlighting device—may be based on the same semiconductor material, in particular on a nitride compound semiconductor material such as AlGaInN.

"Based on nitride compound semiconductor material" means that the luminescence diode chips or at least a portion thereof, particularly preferably at least an active zone and/or the growth substrate wafer, comprises or consists of a nitride compound semiconductor material, preferably AlGaInN—that is to say $Al_nGa_mIn_{1-n-m}N$, where $0 \le n \le 1$, $0 \le m \le 1$ and $n+m \le 1$. In this case, this material need not necessarily have a mathematically exact composition according to the above formula. Rather, it can comprise, for example, one or more dopants and additional constituents. For the sake of simplicity, however, the above formula only includes the essential constituents of the crystal lattice (Al, Ga, In, N), even if they can be replaced and/or supplemented in part by small amounts of further substances.

Driver circuits that supply different luminescence diode chips with different voltage ranges can advantageously be dispensed with in this way. By way of example, the luminescence diode arrangement preferably contains no red-emitting light-emitting diode chips which have to be operated in a different operating voltage range than blue- or green-emitting luminescence diode chips based on the compound semiconductor material AlInGaN. In this way, the luminescence diode arrangement can be driven in a simpler fashion and with a more cost-effective control unit.

The luminescence diode arrangement and/or the backlighting device may have/has a control unit configured to drive the first luminescence diode chip and the second luminescence diode chip separately from one another. By way of example, the control unit contains a color sensor and/or a temperature sensor.

By way of example, the control unit is configured to regulate the intensity ratio of the blue light emitted by the first luminescence diode chip to the green light emitted by the second light emitting diode chip in dependence of measurement values of the color sensor and/or temperature sensor. In this way, it is advantageously possible for a temperature-dependent or operating-duration-dependent change in the emission spectrum of the mixed light emitted by the luminescence diode arrangement to be reduced to a greater extent or completely compensated for.

The luminescence diode arrangement may have an optoelectronic component which comprises the first luminescence diode chip, the second luminescence diode chip and the luminescence conversion element. The optoelectronic component has, for example, at least two external electrical connections to make electrical contact with the first and second luminescence diode chips. In particular, it has a chip carrier and/or a component housing. The first luminescence diode chip, the second luminescence diode chip and the luminescence conversion element are preferably arranged on the chip carrier and/or in the component housing. The component may have a component encapsulation that preferably encapsulates the first and the second luminescence diode chip on the chip carrier and/or in the component housing.

The component encapsulation contains, for example, a radiation-transmissive potting compound. The radiation-transmissive potting compound may also encapsulate the luminescence conversion element. The radiation-transmissive potting compound may constitute the matrix material in which the phosphor or the phosphors of the luminescence conversion element is or are embedded.

Alternatively, the luminescence diode arrangement has a first optoelectronic component which comprises the first luminescence diode chip. In addition, it has a second, separate optoelectronic component which comprises the second luminescence diode chip.

In this configuration, in particular, either the first optoelectronic component comprises the luminescence conversion element or the first optoelectronic component comprises a first part of the luminescence conversion element and the second optoelectronic component comprises a second part of the luminescence conversion element. By way of example, the first luminescence diode chip and the luminescence conversion element or the first part of the luminescence conversion element are arranged in a reflector trough of the first optoelectronic component, wherein the reflector trough is formed, for example, by a recess of a component housing of the first optoelectronic component. The second luminescence diode chip and, if appropriate, the second part of the luminescence conversion element are arranged, for example, in a reflector trough of the second optoelectronic component formed, in particular, by a recess of a component housing of the second optoelectronic component.

Further advantages and advantageous configurations and developments of the luminescence diode arrangement, of the backlighting device and of the display device will become apparent from the following examples illustrated by way of example in connection with the figures.

In the examples and figures, identical or identically acting elements are provided with the same reference symbols. The figures and the size relationships of the elements illustrated in the figures among one another should not be regarded as to scale, unless a scale is explicitly indicated. If no scale is indicated, individual elements may be illustrated with an exaggerated size to enable better illustration and/or to afford a better understanding.

Figure 1A:
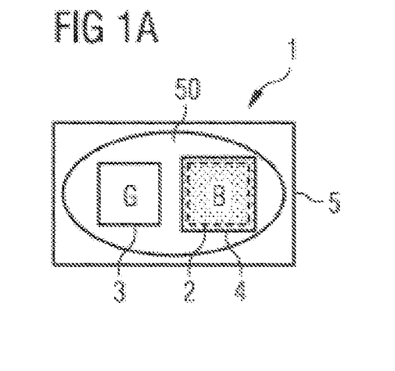
FIG. 1A shows a schematic top view of a luminescence diode arrangement in accordance with a first example.
Figure 1B:
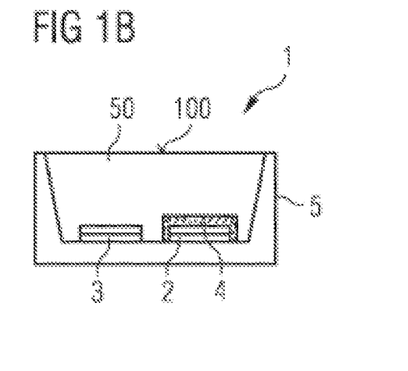
FIG. 1B shows a schematic cross section through the luminescence diode arrangement from FIG. 1A.

FIGS. 1A and 1B show a luminescence diode arrangement according to a first example. FIG. 1A shows a schematic top view of a front side 100 of the luminescence diode arrangement. FIG. 1B shows a schematic cross section through the luminescence diode arrangement.

The luminescence diode arrangement 1 contains a first luminescence diode chip 2 and a second luminescence diode chip 3. The first and the second luminescence diode chip 2, 3 are arranged in a recess 50 of a common component housing 5. The recess 50 can also be designated as a chip trough. It can constitute, for example, a reflector trough and/or a potting trough.

In the case of the luminescence diode arrangement 1 in accordance with the first example, the first luminescence diode chip 2 and the second luminescence diode chip 3 are both based on the compound semiconductor material AlIn-GaN, in particular on the semiconductor material InGaN. By way of example, the luminescence diode chips 2, 3 are light emitting diode chips which are provided in each case for emitting radiation from one of their main faces.

The first luminescence diode chip 2 has an epitaxial semiconductor layer sequence provided for emitting blue light. In particular, the electromagnetic radiation emitted by the semiconductor layer sequence of the first luminescence diode chip 2 during the operation of the luminescence diode arrangement has a dominant wavelength in the blue spectral range, for example, at a wavelength of 430 nm to 480 nm, inclusive of the limits. In the present case, it has a value of 445 to 455 nm, for example of 450 nm. In one variant, it has a value of 435 nm to 445 nm, for example of 440 nm.

The second luminescence diode chip 3 has an epitaxial semiconductor layer sequence configured to emit green light, in particular with a dominant wavelength of 490 nm to 575 nm, preferably 500 nm to 550 nm, in each case inclusive of the limits. By way of example, the dominant wavelength of the green light emitted by the second luminescence diode chip 3 has a value of 525 nm.

Furthermore, the luminescence diode arrangement has a luminescence conversion element 4. In the case of the luminescence diode arrangement in accordance with the first example, the luminescence conversion element 4 is applied to the first luminescence diode chip 2. By way of example, the luminescence conversion element 4 is a converter plate formed on the first luminescence diode chip 2 or applied thereto. In particular, the converter plate is applied or formed on a front-side main face of the first luminescence diode chip 2. The luminescence conversion element 4 can also be embodied as a cap which, in addition to the front-side main area of the first luminescence diode chip 2, covers the side flanks thereof at least in places. In one configuration, the first luminescence diode chip 2 with the luminescence conversion element 4 and the second luminescence diode chip 3 are encapsulated with a light-transmissive, in particular transparent, potting compound that is filled into the recess 50.

In the first example, the luminescence conversion element 4 is different from the potting compound arranged as component encapsulation in the recess 50 to encapsulate the luminescence diode chips 2, 3. Rather, the luminescence conversion element 4 is embodied, in particular, in the manner integrated with the first luminescence diode chip 2 and is mounted together with the epitaxial semiconductor layer sequence of the first luminescence diode chip 2 in the recess 50 of the component housing 5. Preferably, in the case of the luminescence diode arrangement 1 in accordance with the first example, the surface of the recess 50 does not adjoin the luminescence conversion element 4 or the luminescence conversion element 4 adjoins the component housing 5 only with a rear-side and in particular narrow edge region extending around the first luminescence diode chip 2.

By way of example, the luminescence conversion element 4 contains at least one phosphor or consists of at least one phosphor. In one configuration, the at least one phosphor is contained in a ceramic material or the luminescence conversion element 4 consists of a phosphor ceramic which contains, for example, an aluminum nitride. In another configuration, the luminescence conversion element contains particles of the phosphor or phosphors embedded in a matrix material, for example, a thermosetting plastic material or a thermoplastic material. In one configuration, the phosphor particles are embedded in an epoxy resin matrix or a matrix composed of a silicone material.

The luminescence conversion element 4 is configured—in particular by the phosphor or at least one of the phosphors— to convert part of the blue light emitted by the first luminescence diode chip 2 into red light. In particular, the luminescence conversion element 4 is for absorption of electromagnetic primary radiation from the blue spectral range and emission of secondary radiation in the red spectral range to emit, in particular of light having an intensity maximum at a wavelength of 600 nm to 750 nm, in particular 650 nm to 700 nm, in each case inclusive of the limits. By way of example, the intensity maximum of the secondary radiation has a wavelength of 650 nm to 750 nm, preferably 610 nm to 640 nm, in each case inclusive of the limits.

By way of example, the luminescence conversion element 4 contains a phosphor based on aluminum nitride and configured to absorb primary radiation from the blue spectral range and to emit secondary radiation from the red spectral range. In the present case, the phosphor is a phosphor commercially available under the designation BR1 (MCC-AlN) or BR101D from Mitsubishi Chemical Corporation.

In one variation of this example, the luminescence conversion element contains a further phosphor, in particular a garnet phosphor such as YAG:Ce configured to emit secondary radiation from the yellow spectral range. In particular, the secondary radiation of the further phosphor has a wavelength of 550 nm to 600 nm, for example, 565 nm to 585 nm, in each case inclusive of the limits. However the luminescence conversion element 4 is free of a phosphor that emits secondary radiation having an intensity maximum in the green spectral range.

Figure 10:
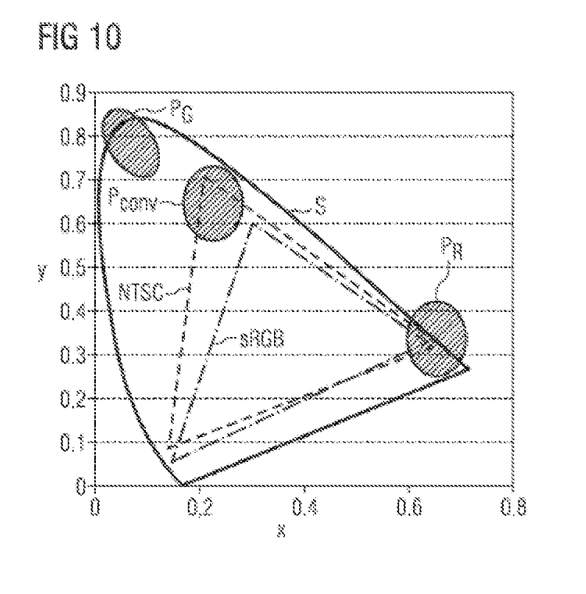
FIG. 10 shows a CIE diagram with various color spaces and also the color loci of the red light and the green light of the luminescence diode arrangement in accordance with the first example.

FIG. 10 shows the color loci of the phosphor that emits red secondary radiation and of the semiconductor layer sequence of the second luminescence diode chip 3 of the luminescence diode arrangement 1 in accordance with the first example in the CIE diagram.

By way of example, the phosphor configured to emit secondary radiation from the red spectral range has a color locus having the co-ordinates [$x_R$, $y_R$] in the CIE diagram, where $x_R \geq 0.6$ and $y_R \geq 0.25$. In particular, the co-ordinates $x_R$ and $y_R$ lie in a region of the CIE diagram that is delimited by $0.6 \leq x_R \leq 0.75$ and $0.25 \leq y_R \leq 0.45$. Preferably, the color locus of the red light lies in a region $P_R$ containing the red corner of the NTSC color space (co-ordinates: x=0.67 and y=0.33) and the color loci whose x and y co-ordinates deviate from this value by 0.1 or less.

The green light emitted by the semiconductor layer sequence of the second luminescence diode chip 3 has, in particular, a color locus in the CIE standard chromaticity diagram which lies in a color locus region $P_G$ containing the color locus on the spectral color line S assigned to the wavelength 520 nm, and the color loci whose distance in the y direction is less than 0.1 and in the y direction is less than 0.15 from said color locus.

By contrast, with phosphors that emit secondary radiation having an intensity maximum in the green spectral range—for example, with orthosilicate phosphors—generally only color loci $P_{conv}$ can be obtained which are further away from the color locus of a green spectral color on the spectral color line S (see FIG. 10). The color locus region $P_{conv}$ that can be obtained with such green-emitting phosphors lies almost completely within the so-called "NTSC color space," delimited by the triangle NTSC having the co-ordinates [0.67; 0.33], [0.21; 0.71] and [0.14; 0.08] in the CIE diagram. A further color space illustrated in FIG. 10 is the so-called "sRGB color space," delimited in the CIE diagram by the triangle sRGB having the co-ordinates [0.64; 0.33], [0.30; 0.60] and [0.15; 0.06].

The luminescence diode arrangement 1 in accordance with the first example is configured to emit mixed light containing blue light of the first luminescence diode chip 2, green light of the second luminescence diode chip 3 and red light of the luminescence conversion element 4. In the CIE diagram, the mixed light has, for example, a color locus having the co-ordinates $x_W$=0.27 and $y_W$=0.24 (see FIG. 12).

Figure 11:
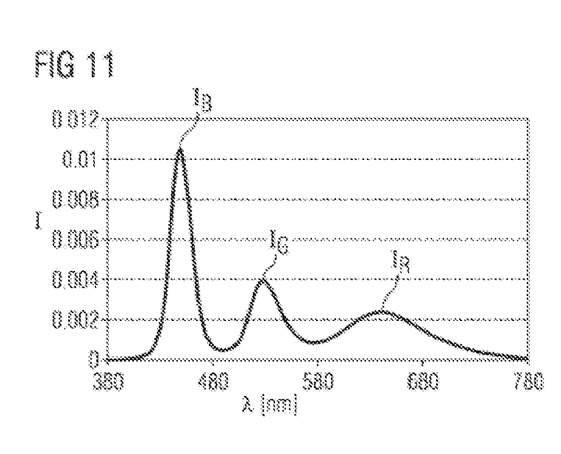
FIG. 11 shows the spectral intensity distribution of the mixed light emitted by the luminescence diode arrangement in accordance with the first example.

FIG. 11 shows the emission spectrum of the mixed light emitted by the luminescence diode arrangement in accordance with the first example. In FIG. 11, the intensity I of the mixed light in arbitrary units is plotted as a function of the emission wavelength λ.

The mixed light has a first emission peak extending from approximately 410 nm to 480 nm and an emission maximum $I_B$ in the blue spectral range, which corresponds to the dominant wavelength of the first luminescence diode chip 2, at 450 nm. A second peak extends from approximately 490 nm to 570 nm with an intensity maximum $I_G$ in the green spectral range at 525 nm, which corresponds to the dominant wavelength of the semiconductor layer sequence of the second luminescence diode chip 3. A third peak of the intensity spectrum of the mixed light extends from approximately 580 nm to at least 750 nm, in particular to approximately 780 nm, and has an intensity maximum $I_R$ in the red spectral range at a wavelength of approximately 640 nm.

The ratios of the intensity maxima of the three peaks are chosen, in particular, such that the mixed light brings about a white color impression. The intensity maxima of the first, second and third peaks have a ratio of approximately 10:4:2 in this case.

Figure 2:
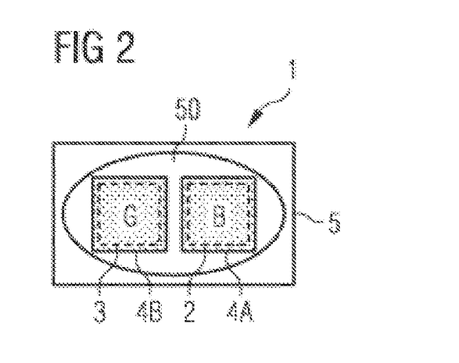
FIG. 2 shows a schematic top view of a luminescence diode arrangement in accordance with a second example.

FIG. 2 shows a schematic top view of the front side 100 of a luminescence diode arrangement 1 in accordance with a second example.

The luminescence diode arrangement 1 in accordance with the second example differs from that of the first example in that the second luminescence diode chip 2 is also provided with the luminescence conversion element 4. By way of example, a first part 4A of the luminescence conversion element is applied to the semiconductor layer sequence of the first luminescence diode chip and a second part 4B of the luminescence conversion element is applied to the semiconductor layer sequence of the second luminescence diode chip 3.

The first part 4A and/or the second part 4B of the luminescence conversion element can be embodied, for example, analogously to the configuration of the luminescence conversion element 4 described in connection with the first example. In particular, the first part 4A and/or the second part 4B can be in each case a converter plate or a cap that at least partly encloses the respective semiconductor layer sequence.

Figure 3A:
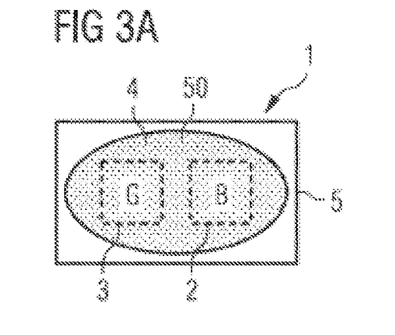
FIG. 3A shows a schematic top view of a luminescence diode arrangement in accordance with a third example.
Figure 3B:
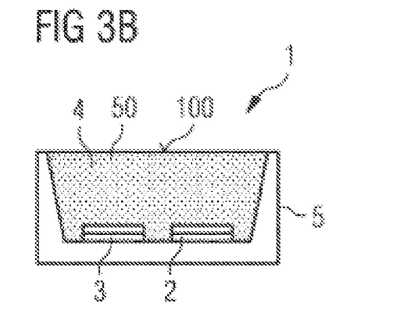
FIG. 3B shows a schematic cross section through the luminescence diode arrangement from FIG. 3A.

FIGS. 3A and 3B show a luminescence diode arrangement 1 in accordance with a third example in a schematic top view of the front side 100 (FIG. 3A) and in a schematic cross section (FIG. 3B).

In contrast to the first and second examples, in the third example the luminescence conversion element 4 is not embodied as a layer applied on the semiconductor layer sequence of the first and, respectively, of the first and second luminescence diode chip 2, 3. Instead, the luminescence conversion element 4 is integrated with the component encapsulation that encapsulates the luminescence diode chips 2, 3. In this case, the component encapsulation contains a potting compound preferably comprising an epoxy resin and/or a silicone material.

Expediently, in this example, the first and the second luminescence diode chip 2, 3 are encapsulated by the luminescence conversion element 4 in the recess 50 of the component housing 5. Preferably, the luminescence conversion element 4 fills the recess 50 partly or completely and adjoins, in particular, a bottom area and/or at least one side area of the recess 50. In particular, it covers the entire bottom area of the recess 50 in a top view of the front side.

Particularly in configurations such as the second and third examples in which the second light emitting diode chip 3 is covered by the luminescence conversion element 4 and respectively 4B, the luminescence conversion element can be configured to convert part of the green light emitted by the second luminescence diode chip 3 into red light and/or into yellow light. In this case, the conversion of green light of the second luminescence diode chip 3 into red light may have a lower efficiency than the conversion of blue light of the first luminescence diode chip 2 into red light.

Figure 4A:
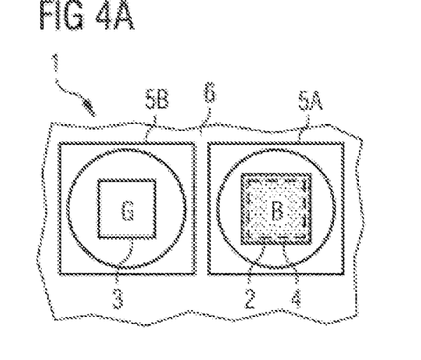
FIG. 4A shows a schematic top view of a section from a luminescence diode arrangement in accordance with a fourth example.
Figure 4B:
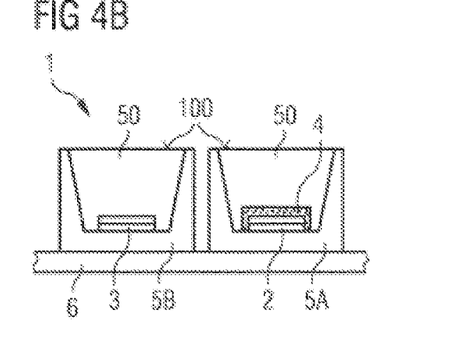
FIG. 4B shows a schematic cross section through the luminescence diode arrangement from FIG. 4A.

FIGS. 4A and 4B show a luminescence diode arrangement 1 in accordance with a fourth example in a schematic top view of the front side 100 (FIG. 4A) and in a schematic cross section (FIG. 4B).

The luminescence diode arrangement 1 in accordance with the fourth example differs from that of the first example in that the first luminescence diode chip 2 is arranged in the reflector trough 50 of a first component housing 5A and the second luminescence diode chip 3 is arranged in the reflector trough 50 of a second component housing 5B, which is different from the first component housing. The component housings 5A, 5B can be mounted, for example, on a common component carrier 6.

As in the case of the first example, the luminescence conversion element 4 is applied as a luminescence conversion layer on the first luminescence diode chip 2. By way of example, the reflector trough 50 of the second component housing contains no luminescence conversion element.

Figure 5A:
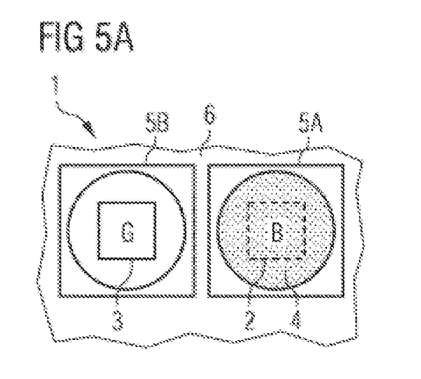
FIG. 5A shows a schematic top view of a section from a luminescence diode arrangement in accordance with a fifth example.
Figure 5B:
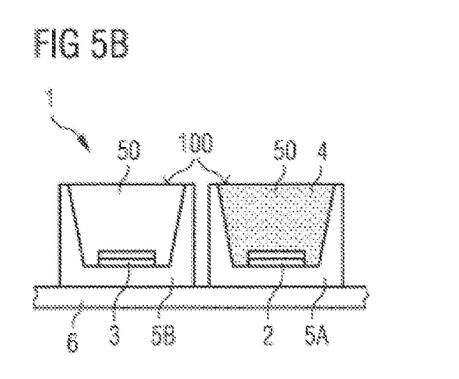
FIG. 5B shows a schematic cross section through the luminescence diode arrangement from FIG. 5A.

FIGS. 5A and 5B show a fifth example of a luminescence diode arrangement 1 in a schematic top view of the front side 100 (FIG. 5A) and in a schematic cross section (FIG. 5B).

The luminescence diode arrangement 5 in accordance with the fifth example substantially corresponds to that of the fourth example, but with the difference that the luminescence conversion element is not applied as a layer to the first luminescence diode chip 2. Instead—analogously to the third example—the luminescence conversion element 4 is integrated with the potting compound that encapsulates the first luminescence diode chip 2. In particular, the luminescence conversion element 4 is filled into the reflector trough 50 of the first component housing 5A.

The reflector trough 50 of the second component housing 5B can, for example, be free of a potting compound or be partly or completely filled with a translucent or transparent potting compound, wherein the translucent or transparent potting compound contains, in particular, no phosphor.

Figure 6:
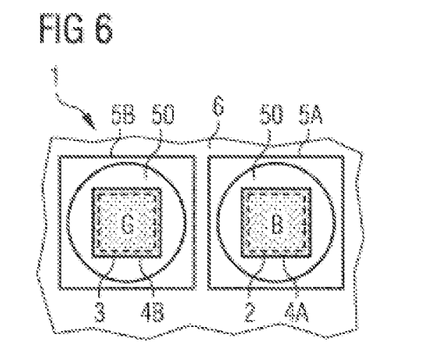
FIG. 6 shows a schematic top view of a section from a luminescence diode arrangement in accordance with a sixth example.

FIG. 6 shows a sixth example of a luminescence diode arrangement 1 in a top view of the front side 100 thereof.

As in the case of the second example, the first luminescence diode chip 2 is provided with a first part 4A of the luminescence conversion element and the second luminescence diode chip 3 is provided with a second part 4B of the luminescence conversion element. In contrast to the second example, however, the first and the second luminescence diode chip 2, 3 are arranged in separate component housings 5A, 5B. In particular, the first luminescence diode chip 2 and the first part 4A of the luminescence conversion element are arranged in the reflector trough 50 of the first component housing 5A and the second luminescence diode chip 3 and the second part 4B of the luminescence conversion element are arranged in the reflector trough 50 of the second component housing 5B.

Figure 7:
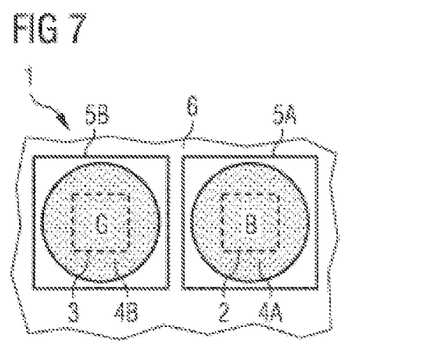
FIG. 7 shows a schematic top view of a section from a luminescence diode arrangement in accordance with a seventh example.

FIG. 7 shows a seventh example of a luminescence diode arrangement 1 in a top view of the front side 100 thereof.

This example differs from the sixth example in that the first part 4A and the second part 4B of the luminescence conversion element are embodied as potting compound that encapsulates the respective luminescence diode chip 2 and 3 in the reflector trough 50 of the respective component housing 5A and 5B.

Figure 8:
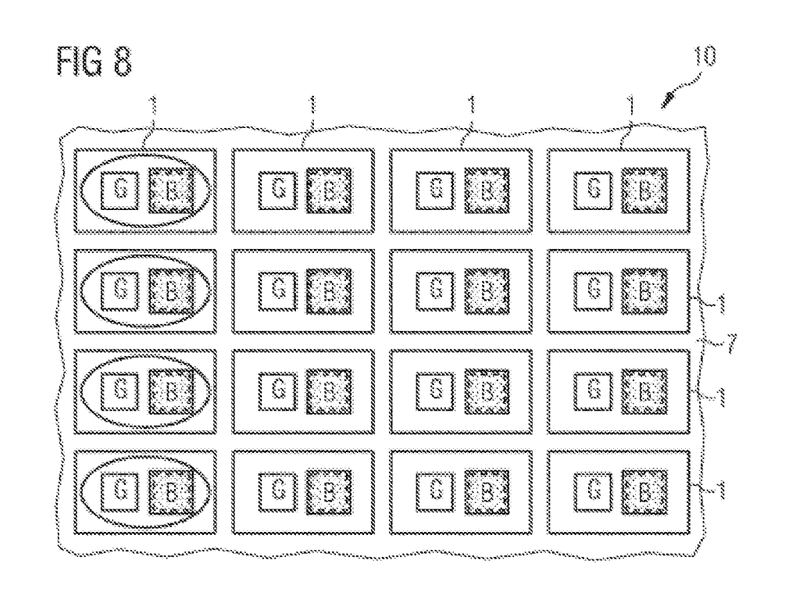
FIG. 8 shows a schematic top view of a section from a backlighting device in accordance with an example.

FIG. 8 shows an example of a backlighting device 10 in a schematic top view.

The backlighting device 10 contains a plurality of luminescence diode arrangements 1, which can be embodied, for example, in accordance with the first example. The luminescence diode arrangements 1 of the other examples are also suitable for the backlighting device 10.

The luminescence diode arrangements 1 can be arranged, for example, on a common device carrier 7. In this configuration, they are arranged in rows and columns.

Figure 9:
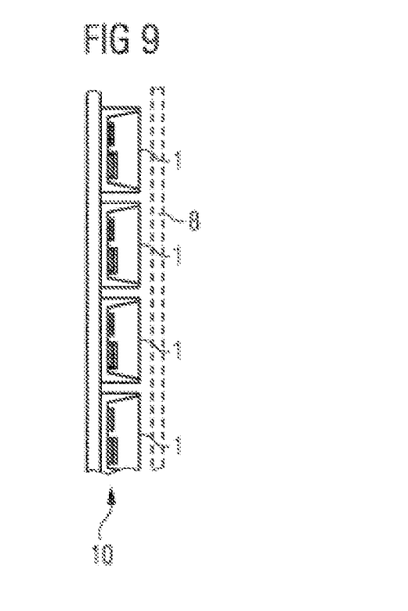
FIG. 9 shows a schematic cross section through a display device in accordance with an example.

FIG. 9 shows a display device comprising the backlighting device 10 in accordance with the example from FIG. 8 in a schematic cross section. In the case of the display device in accordance with the example in FIG. 9, which, in particular, is an LCD, the backlighting device 10 backlights a light valve arrangement 8 containing, in particular, a multiplicity of liquid crystal cells.

Figure 12:
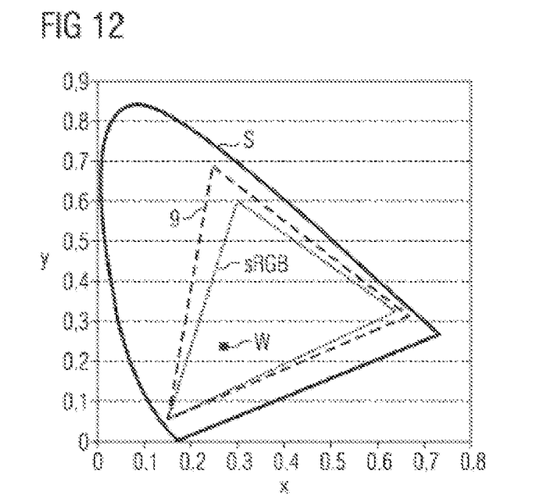
FIG. 12 shows a CIE diagram with the color space that can be obtained by the display device in accordance with the example from FIG. 9.

FIG. 12 shows the gamut 9—obtainable by the backlighting device 10—of the display device in accordance with the example in FIG. 9 in the CIE standard chromaticity diagram.

The gamut 9 of the display device has, upon representation in the CIE standard chromaticity diagram, an area content that is significantly greater than that of the sRGB color space (illustrated by the triangle designated by sRGB in FIG. 12). In particular, the area content of the gamut 9 amounts to approximately 110% of the area content of the NTSC color space depicted in FIG. 10.

In one instance, the display device has a backlighting device 10 in which the first luminescence diode chips 2 of the luminescence diode arrangements 1 have a dominant wavelength of 440 nm, instead of 450 nm as in the first example. In this case, the gamut 9 of the display device has, in particular, an area content of 120% or more of the area content of the NTSC color space.

Our arrangements and devices are not restricted to the examples by the description on the basis of the examples. Moreover, this disclosure encompasses any novel feature and also any combination of features, even if the feature or combination is not explicitly specified in the appended claims or examples.

The invention claimed is:

1. A luminescence diode arrangement comprising a first luminescence diode chip, a second luminescence diode chip and a luminescence conversion element which is a converter plate, wherein the first luminescence diode chip emits blue light;

the second luminescence diode chip contains a semiconductor layer sequence that emits greens light;

the luminescence conversion element converts part of the blue light emitted by the first luminescence diode chip into red light;

the luminescence diode arrangement emits mixed light containing blue light of the first luminescence diode chip, green light of the second luminescence diode chip and red light of the luminescence conversion element from a front side of the luminescence diode arrangement wherein, in a top view of the front side, the first luminescence diode chip is covered by the luminescence conversion element in selected locations and the second luminescence diode chip is not covered by the luminescence conversion element, and the luminescence diode arrangement comprises an optoelectronic component, which comprises the first luminescence diode chip, the second luminescence diode chip and the luminescence conversion element, in a common reflector trough.

2. The luminescence diode arrangement according to claim 1, wherein the mixed light provides a white color impression.

3. The luminescence diode arrangement according to claim 1, wherein the green light emitted by the second luminescence diode chip has a color locus having the coordinates [$x_G$, $y_G$] in a CIE standard chromaticity diagram, wherein $x_G \leq 0.15$ and $y_G \geq 0.7$.

4. The luminescence diode arrangement according to claim 1, wherein the luminescence conversion element converts part of the green light emitted by the second luminescence diode chip into red light.

5. The luminescence diode arrangement according to claim 1, which emits the mixed light from a front side, wherein, in a top view of the front side, the first luminescence diode chip and the second luminescence diode chip are covered by the luminescence conversion element in selected locations.

6. The luminescence diode arrangement according to claim 1, wherein the luminescence conversion element additionally converts blue light of the first luminescence diode chip and/or green light of the second luminescence diode chip into yellow light.

7. The luminescence diode arrangement according to claim 1, wherein all the luminescence diode chips of the luminescence diode arrangement are based on the same semiconductor material.

8. The luminescence diode arrangement according to claim 1, wherein all the luminescence diode chips of the luminescence diode arrangement contain semiconductor layer sequences configured to emit visible light having a dominant wavelength outside a red spectral range.

9. The luminescence diode arrangement according to claim 1, wherein the mixed light has an intensity maximum in a green spectral range and the luminescence diode arrangement is free of a phosphor having a dominant wavelength from the green spectral range.

10. The luminescence diode arrangement according to claim 1, further comprising a control unit which drives the first luminescence diode chip and the second luminescence diode chip separately.

11. The luminescence diode arrangement according to claim 1, comprising a first optoelectronic component which comprises the first luminescence diode chip, and comprising a second optoelectronic component which comprises the second luminescence diode chip, wherein the first optoelectronic component comprises the luminescence conversion element or the first optoelectronic component comprises a first part of the luminescence conversion element and the second optoelectronic component comprises a second part of the luminescence conversion element.

12. A backlighting device for a display device comprising a plurality of luminescence diode arrangements according to claim 1.

13. A liquid crystal display device comprising a backlighting device according to claim 12, wherein, with the mixed light emitted by the backlighting device, a gamut is obtained whose area content upon representation in a CIE standard chromaticity diagram amounts to at least 110 percent of an area content of an NTSC color space.

14. The luminescence diode arrangement according to claim 1, wherein the luminescence conversion element is a converter plate formed on a front-side main face of the first luminescence diode chip or applied thereto or wherein the luminescence conversion element is a cap formed on the front-side main area of the first luminescence diode chip or applied thereto and which covers side flanks of the first luminescence diode chip in selected locations.

15. The luminescence diode arrangement according to claim 14, wherein the first luminescence diode chip with the luminescence conversion element and the second luminescence diode chip are encapsulated with a light-transmissive potting compound different from the luminescence conversion element.

* * * * *